United States Patent [19]

Dupré

[11] Patent Number: 5,386,159

[45] Date of Patent: Jan. 31, 1995

[54] GLITCH SUPPRESSOR CIRCUIT AND METHOD

[75] Inventor: Jean L. Dupré, Boisbriand, Canada

[73] Assignee: Harris Corporation, Melbourne, Fla.

[21] Appl. No.: 83,517

[22] Filed: Jun. 30, 1993

[51] Int. Cl.⁶ ............................................. H03K 5/05
[52] U.S. Cl. .................................. 327/310; 327/385; 327/551
[58] Field of Search ............... 307/572, 542.1, 542, 307/443, 445, 234, 247.1; 328/111, 72, 120, 165, 162, 164; 377/71

[56] References Cited

U.S. PATENT DOCUMENTS

| | | | |
|---|---|---|---|
| 3,886,543 | 5/1975 | Marin | 302/542.1 |
| 4,353,032 | 10/1982 | Taylor | 328/111 |
| 4,427,948 | 1/1984 | Rinaldi | 328/120 |
| 4,525,635 | 6/1985 | Gillberg | 307/542 |
| 4,775,840 | 10/1988 | Ohmori et al. | 307/443 |
| 5,001,374 | 3/1991 | Chang | 328/111 |
| 5,059,834 | 10/1991 | Tago et al. | 307/542 |

*Primary Examiner*—Timothy P. Callahan
*Assistant Examiner*—Dinh Le
*Attorney, Agent, or Firm*—Rogers & Killeen

[57] ABSTRACT

A resettable glitch suppression circuit integrated into each input control line of a semiconductor chip to provide flexibility for each control line as to whether or not, and if so when, the glitch suppression circuit is operable.

6 Claims, 2 Drawing Sheets

GLITCH SUPPRESSOR CIRCUIT AND METHOD

BACKGROUND OF THE INVENTION

The present invention relates to the suppression of "glitches", i.e., those unwanted variations in control signals which result from contact bounce, interference of various types and/or noise.

Low voltage control signals are applied to semiconductor devices for myriad reasons, and an unwanted variation in such control signals often has serious adverse effects on the operation of the circuit. It is known to suppress these temporary variations by requiring that any change in the control signal appear for a predetermined finite period of time before it is recognized as a desired control signal and not as an undesired transient. By way of example, U.S. Pat. No. 4,525,635 dated Jun. 25, 1985 discloses the use of two bistable devices as a transient suppression circuit, with the two bistable devices used to sample the control signal at two different times and concurrence of the bistable devices required for propagation of the control signal into the circuit. In this way, the binary state of the control signal must remain constant over the two samples for the signal to be recognized as a control signal, and the glitch suppression circuit acts as a filter for transients having less duration than the two samples.

However, there are times when it is desired to bypass the glitch suppression circuit and to propagate the control signal directly into the circuit and it is accordingly an object of the present invention to provide a novel circuit and method for selectively bypassing a glitch suppression circuit.

It is another object of the present invention to provide a novel selectively bypassable glitch suppression circuit which can be integrated into the control lines for an operating circuit.

It is a further object of the present invention to provide a novel selectively operable transient filter circuit and method.

It is yet another object of the present invention to provide a novel circuit and method which may be integrated into the design of a semiconductor device without regard to the desirability of the glitch suppression circuit in the application of the integrated circuit.

It is still another object of the present invention to provide a novel integrated circuit and method which contains a glitch suppression circuit in every input line and thus avoids any additional constraint from either temperature or process parameters on the operating circuit.

These and many other objects and advantages will be readily apparent to one skilled in the art to which the invention pertains from a perusal of the claims, the appended drawings, and the following detailed description of a preferred embodiment.

DESCRIPTION OF PREFERRED EMBODIMENTS

Figure 1:
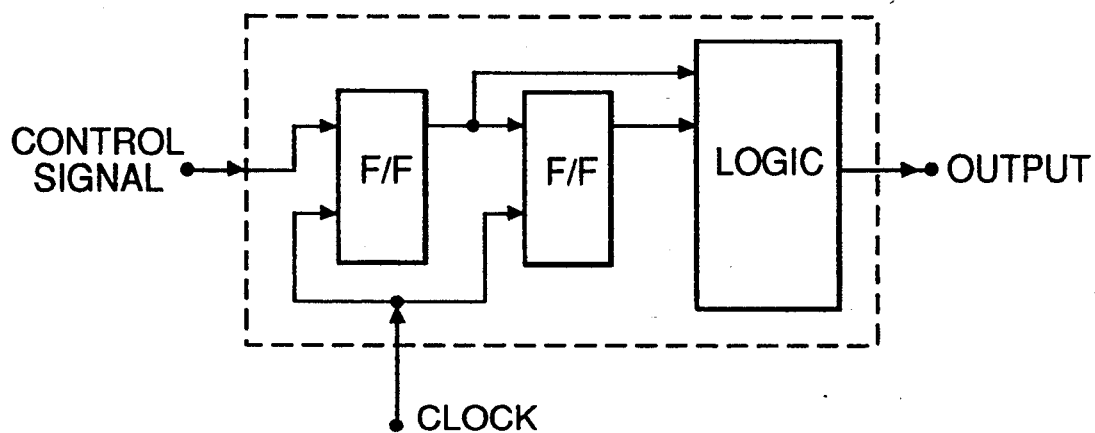
FIG. 1 is a schematic circuit diagram of a prior art glitch suppression circuit.

As shown in FIG. 1, the prior art glitch suppression circuits typically contain two bistable devices or flip-flops which sample and store the state of a control signal at two different clock intervals. When the state of the control signal remains unchanged for the requisite time interval, a logic circuit provides an output signal to the operating circuit.

Figure 2:
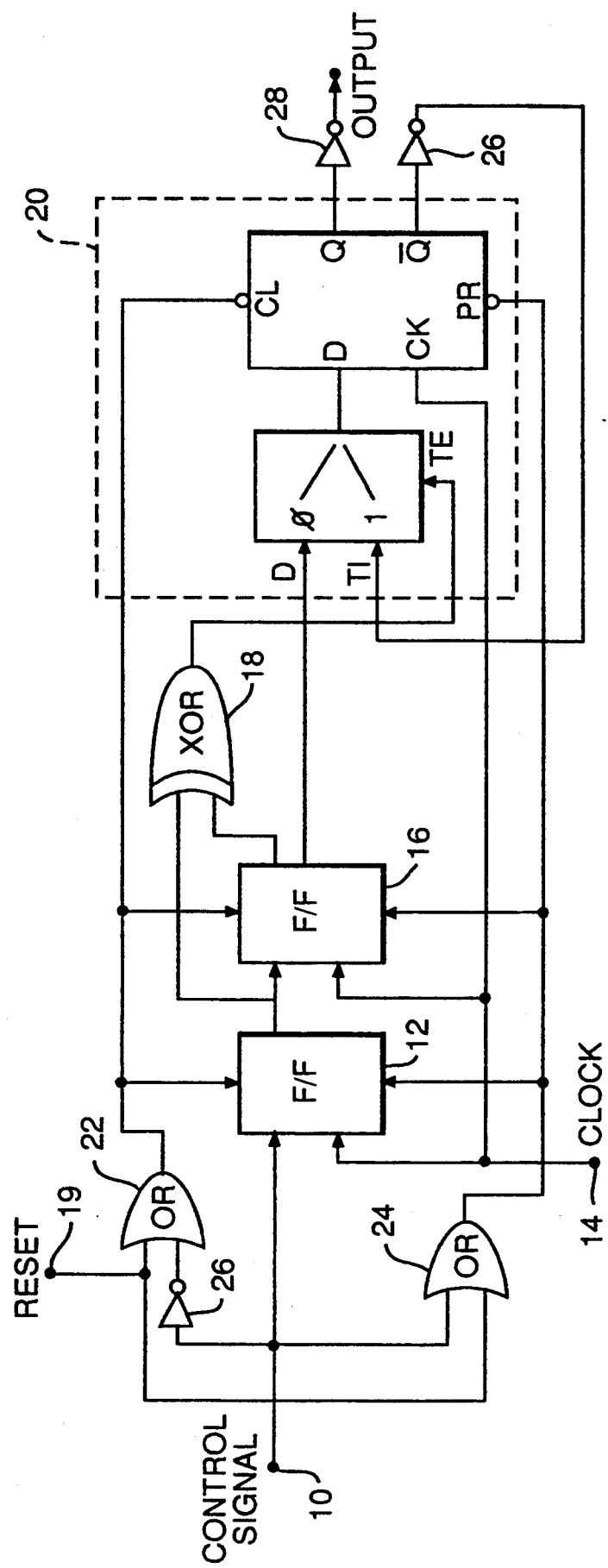
FIG. 2 is a schematic circuit diagram of the selectively bypassable glitch suppression circuit of the present invention.

As shown in FIG. 2, a glitch suppression circuit of the present invention includes an input terminal 10 receives a control signal and is connected to an input terminal of a first bistable device 12 which is sampled a time T1 by the application of a clock signal from an input terminal 14.

When toggled by the clock signal at time T2, the bistable device 12 provides an output signal which reflects the state of the control signal at time T1. This signal is applied to an input terminal of a second bistable device 16. At time T3, the clock signal causes the output state of the control signal at time T2 to be reflected as the output signal of the bistible device 12 and the output signal from the bistable device 16 to reflect the state of the control signal at time T1.

The known prior art glitch circuits operate substantially as thus far described. In the prior art circuits, a logic circuit responsive to the output signals from the two flip-flops provides the output signal of the glitch suppressor circuit. In this way, the glitch suppressor circuit provides an output signal only when the state of the control signal has remained unchanged for two successive clock cycles.

With continued reference to FIG. 2, the output signals from the bistable devices 12 and 16 are applied to the two input terminals of an Exclusive OR ("XOR") gate 18 which provides a signal to the "Clear" input terminal CL of a third flip-flop 20.

The third flip-flop 20 is connected to function as a multiplexer for (a) the negative output signal from the bistable device 16 and (b) the output signal from the negative Q terminal of the flip-flop (through an inverter 26), and to treat the multiplexed signal as the input signal to terminal D of the flip-flop 20.

The output signal from the OR gate 22 is applied to the CL input terminal and the output signal from the OR gate 24 is applied to the "Preset" input terminal PR of the flip-flop 20. Note in FIG. 2 that the terminals CL and PR have been reversed for convenience in drafting. The output signal from the positive Q output terminal is applied through an inverter 28 as the output signal of the glitch suppressor circuit.

In this way, the glitch suppressor circuit of the present invention provides an output signal only when the state of the control signal has remained unchanged for two successive clock cycles.

Because there are control lines as to which no glitch suppressor is desired, and because there are times when a glitch suppressor is not desired for a control line, the circuit of the present invention provides for a selective bypass.

With continued reference to FIG. 2, a reset signal may selectively be applied by way of an input terminal 19 to one input terminal of two, two input terminal, OR gates 22 and 24. The control signal is applied to the other input terminal of the two OR gates 22 and 24, through an inverter 26 in the case of the OR gate 22. In this way, OR gate 22 provides an output signal in response to either a binary low control signal or a binary high reset signal, and OR gate 24 provides an output signal in response to either a binary high control signal or a binary high reset signal. As a result, an output signal from one of the two OR gates 22 and 24 will be provided for each transition of the control signal as well as a result of the application of a reset signal to the input terminal 19.

The output signals from the OR gates 22 and 24 are applied to complementary reset terminals (i.e., CL and PR) of both of the bistable devices 12 and 16 and he flip-flop 20 so that all three will be reset.

From the foregoing, it may be seen that the glitch suppressor circuit of the present invention becomes transparent to the control signal when a reset signal is present on the input terminal 19, and that the control signal as sampled during successive clock cycles will be propagated therethrough without the requirement that the state of the control signal remain the same for two clock cycles. The control signal, accordingly, may be propagated through the glitch suppression circuit during a single clock cycle.

It is to be understood that the number of bistable devices may be increased for any given clock signal to enlarge the time period over which the state of the control signal must remain constant to be recognized as such. Thus the number of clock cycles during which the control signal must remain unchanged may be controlled by the number of series connected bistable devices.

The bistable devices and gates referenced herein may be any suitable conventional circuits capable of performing the functions indicated. In addition, other functionally equivalent circuits may be employed. Even where the same circuit elements are used, the connections may be varied, with the addition or deletion of inverters, to balance the use of positive and negative gong output signals, etc.

Figure 3:
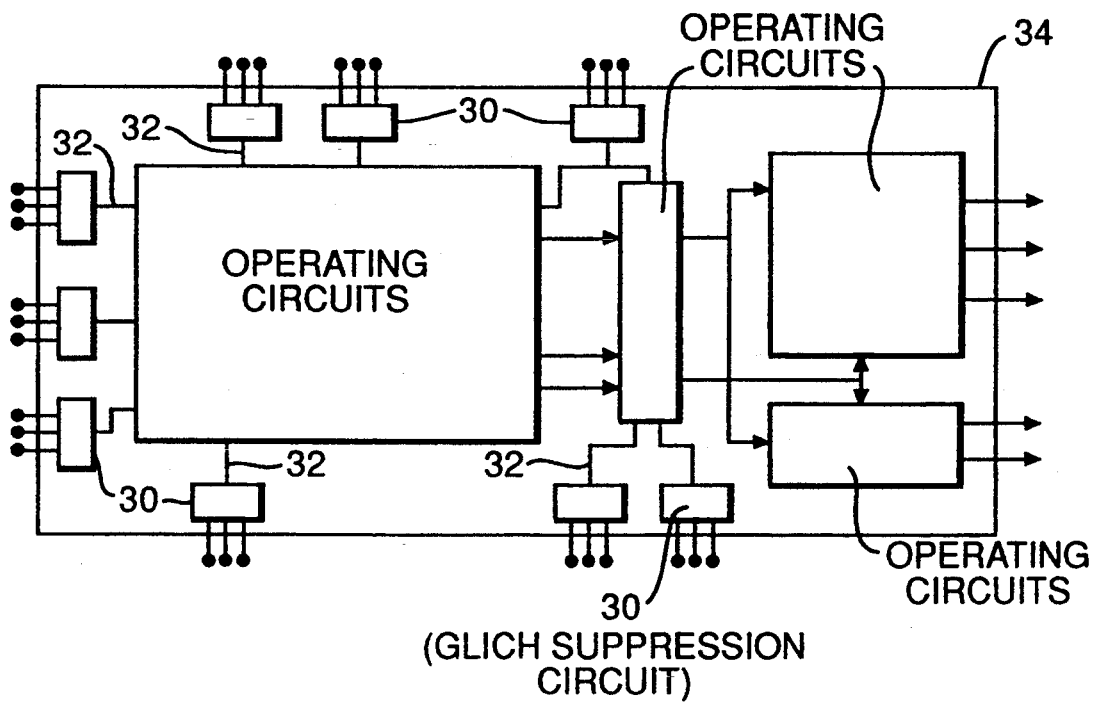
FIG. 3 is a functional block diagram of the bypassable glitch suppression circuit of the present invention integrated into a semiconductor chip.

In the design and manufacture of integrated circuits, it has heretofore not been practical to incorporate glitch suppressor circuits in the control lines because of the flexibility needed or such ICs, both as to the decision as to whether such a suppressor was needed on a control line at all, and if so, as to when such suppressor was desired. FIG. 3 shows a hypothetical IC in which the on-chip components which play no part in this invention are illustrated as function blocks on which the labels have been omitted because the function is unknown and irrelevant to the invention. As shown in FIG. 3, the present invention permits the integration of the glitch suppressor circuit 30 of the present invention into each control line 32 of an integrated circuit 34 without regard for such considerations, with knowledge that the decision as to whether and when to include may be later resolved by the selective application of a simple reset signal. By designing the glitch suppressor circuits into each control line 32 of the IC 34, the cost of the glitch suppressor circuit is significantly reduced.

As shown in FIG. 3, three input lines are provided to each of the glitch suppressor circuits, i.e., one each for the control signal, clock and reset signal. Of course, the clock signal may be provided from one or more sources internal of the IC 34 and the necessity for the third external connection thus obviated.

When designed into an IC, the glitch suppressor circuit of the present invention may be used as a filter, to reduce the noise sensitivity of a circuit, to debounce switch contacts thus permitting direct connection to the IC, and to suppress the effects of sampling during transition of the control signal due to a lock of synchronism between the clock and control signals.

Further, the integration of the glitch suppression circuit into the IC subjects it to the same process parameters during manufacturing and subjects it to the same temperature conditions during operation. Thus the glitch suppression circuit imposes no constraints on the IC.

These and many other advantages will be apparent from the foregoing specification when read in connection with the drawings and the appended claims. While a preferred embodiment of the present invention have been described, it is to be understood that the embodiments described are illustrative only and that the scope of the invention is to be defined solely by the appended claims when accorded a full range of equivalence, many variations and modifications naturally occurring to those skilled in the art from a perusal hereof.

What is claimed is:

1. In a glitch suppression circuit containing plural bistable devices which receives a binary control signal over two or more clock cycles and which does not change the state of a binary output signal unless the control signal remains at the same state for two or more clock cycles, a selective bypass comprising means operatively connected to the bistable devices for selectively propagating said control signal through the glitch suppression circuit during a single clock cycle.

2. The glitch suppression circuit of claim 1, wherein said means for selectively propagating a control signal includes means for selectively resetting each of said bistable devices during a single clock cycle.

3. The glitch suppression circuit of claim 1, wherein said glitch suppression circuit includes three or more resettable bistable devices.

4. A glitch suppression circuit comprising:
a first bistable device for receiving a control signal and for providing a first output signal related to the state thereof at a time T2;
a second bistable device for receiving said first output signal and for providing a second output signal related to the state of said first output signal at a time T1;
a third bistable device;
means for applying successive clock cycles to said first, second and third bistable devices;
means for providing a third output signal for application to said third bistable device when the state of said first and second output signals changes between the times T1 and T2; and
reset means, operable independently of the state of said control signal, for setting said first, second and third bistable devices to a predetermined state so that the state of the control signal when sampled during each clock cycle may be propagated therethrough.

5. An integrated circuit comprising:
one or more operating circuits each having one or more control signal lines;
a glitch suppression circuit located in each of said control lines, each of said glitch suppression circuits including bypass means and a bypass control line for selectively bypassing the glitch suppression function in response to the application of a signal to the control line thereof.

6. In a glitch suppression circuit having a control signal applied to the first of a plurality of series connected bistable devices logically connected together to provide an output signal only when the state of the control signal remains unchanged for a number of clock cycles equal to the number of series connected bistable devices, the method of selectively bypassing the function of the circuit comprising the steps of selectively resetting each of the bistable devices during each of the clock cycles whereby the output signal from the last of the binary devices during successive clock cycles represents the state of the control signal during successive clock cycles.

* * * * *